(12) United States Patent
Butler et al.

(10) Patent No.: US 6,282,219 B1
(45) Date of Patent: Aug. 28, 2001

(54) SUBSTRATE STACK CONSTRUCTION FOR ENHANCED COUPLING EFFICIENCY OF OPTICAL COUPLERS

(75) Inventors: Jerome K. Butler, Richardson; Lily Y. Pang, McKinney; Philip A. Congdon, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/133,023

(22) Filed: Aug. 12, 1998

(51) Int. Cl.[7] ............................................. H01S 5/00
(52) U.S. Cl. ........................ 372/50; 372/50; 372/43; 372/102; 385/50; 385/37; 385/15; 385/31; 385/39
(58) Field of Search ................... 372/50, 43, 102; 385/50, 37, 15, 31, 39

(56) References Cited

U.S. PATENT DOCUMENTS

| | | | |
|---|---|---|---|
| 4,860,298 | * 8/1989 | Botez et al. ........................ | 372/45 |
| 5,003,550 | * 3/1991 | Welch et al. ...................... | 372/50 |
| 5,101,413 | * 3/1992 | Botez ................................ | 372/50 |
| 5,159,603 | * 10/1992 | Kim ................................... | 372/45 |
| 5,655,041 | * 8/1997 | Forrest et al. .................... | 385/49 |
| 5,673,284 | * 9/1997 | Congdon et al. ................. | 372/50 |
| 6,031,243 | * 2/2000 | Taylor ............................... | 257/13 |
| 6,064,783 | * 5/2000 | Congdon et al. ................. | 385/15 |

* cited by examiner

*Primary Examiner*—Robert H. Kim
*Assistant Examiner*—Delma R. Flores Ruiz
(74) *Attorney, Agent, or Firm*—Bret J. Petersen; Frederick J. Telecky, Jr.

(57) ABSTRACT

A grating (461) assisted coupling of a semiconductor waveguide to a dielectric waveguide (451) is provided with one or more reflective stacks (330, 332, 334) to enhance the coupling efficiency. The glass or dielectric core (458) may be efficiently butt-coupled to the core of an optical fiber (470). A laser and semiconductor waveguide, reflective stacks coupling grating, and dielectric waveguide are integrated on a single substrate. Further, multiple lasers (410, 420, 430, 440) with differing lasing frequencies may be integrated and their outputs grating coupled into a single dielectric waveguide (450) for wavelength division multiplexing.

7 Claims, 7 Drawing Sheets

SUBSTRATE STACK CONSTRUCTION FOR ENHANCED COUPLING EFFICIENCY OF OPTICAL COUPLERS

The U.S. Government has a paid-up license in this invention and the right in limited circumstances to require the patent owner to license others on reasonable terms as provided for by the terms of DAAL01-95-C-3524 awarded by U.S. Army Research Laboratory.

FIELD OF THE INVENTION

The invention relates to optoelectronic semiconductor devices, circuits, and waveguides, and, more particularly, to semiconductor lasers integrated with dielectric waveguides and methods of fabrication.

BACKGROUND OF THE INVENTION

Optical communications systems typically employ semiconductor laser sources and glass optical fiber communication channels. There are many configurations of semiconductor lasers including various material compositions and various dimensions of the grown layers that form the active region and an associated optical waveguide in the laser structure. The material composition of the active region determines the wavelength of operation. For example, at lasing wavelengths around 9000 Angstroms, the III–IV materials of the ternary compound AlxGa(1-x)As with GaAs quantum wells provide a compact and rugged source of infrared light which can be easily modulated by varying the diode current. Light from a laser can be extracted by abutting an optical fiber thereto in known manner, however, devices fabricated in this manner do not lend themselves to semiconductor fabrication. Lasers can be abutted to optical fibers, however the indices of refraction between optical fibers and the semiconductor material forming the laser are so dissimilar that the amount of coupling may be very low, leading to an inefficient device. Furthermore, the alignment of the source with an optical fiber is quite tedious when high coupling efficiency is desired. This mismatch of the light field of the laser and that of the optical fiber also affect the amount of light coupled to the fiber.

For example, the output of a stripe heterojunction diode semiconductor laser, typically operated in the lowest order TE mode, has a highly asymmetric near field pattern (see end on view of FIG. 1a) and a wide vertical spread angle (numerical aperture ~0.35, see elevation view of FIG. 1b) but a small horizontal spread (numerical aperture ~0.1) due to the typically large difference in index of refraction between the active core and the cladding and the small height to width ratio of the cavity. In contrast, communication channel optical fibers which would carry the output of the semiconductor laser has a circular core (see end on view of FIG. 2a) and a small spread angle due to the small difference between the index of refraction of the core and the cladding (see elevation view of FIG. 2b); that is, the numerical aperture is symmetric and small (~0.15). Thus the direct coupling of the semiconductor laser output into an optical fiber has low efficiency due to mode field mismatching, and the usual approach to this problem inserts a lens between the laser and the optical fiber or to form the fiber end into a lens. FIG. 3a shows such a lens insertion to provide a high efficiency coupling, and FIG. 3b shows an optical fiber with its end rounded into a lens. Brenner et al, Integrated Optical Modeshape Adapters in InGaAsP/InP for Efficient Fiber-to-Waveguide Coupling, 5 IEEE Phot.Tech.Lett. 1053 (1993), describe a semiconductor waveguide with vertically tapered core and thickened cladding at a waveguide end for better coupling to a lensed optical fiber.

A previous co-assigned invention, (U.S. Pat. No. 5,673, 284), the contents of which are incorporated herein by reference, introduced a semiconductor laser integrated with a silicon dioxide based waveguide having high efficiency coupling of the laser output into the waveguide by a integrated grating and a method of fabrication. This permits the laser output to be simply coupled into an optical fiber by a simple butt coupling of the optical fiber to the waveguide. Further, multiple lasers with different wavelengths can be integrated and their outputs coupled and combined into a single waveguide for wavelength division multiplexed operation.

In the device described in the above noted application, the direct coupling of the semiconductor laser output into an optical fiber was improved over the prior art by providing a semiconductor laser integrated with a silicon dioxide based waveguide which has far field mode shape nearly matches the optical fiber. The coupling from the laser to the co-integrated silicon oxide waveguide is achieved through the use of sub-mm gratings. The grating is integrated between the laser waveguide and the oxide waveguide, preferably in the laser waveguide. The grating, when appropriately designed such as the length, tooth height and period, provides a matching of the propagation in the laser with the propagation in the glass. The amount of light coupled from the laser waveguide to the glass waveguide ranges from 30 to 40 percent. The loss of power to the substrate is the major factor that limits the coupling efficiency.

SUMMARY OF THE INVENTION

An embodiment of the present invention is directed to improving the efficiency of a grating coupled waveguide. While grating assisted directional couplers can be very efficient when the two waveguides have similar indexes of refraction, due to inefficient coupling, waveguides fabricated from materials with highly different refractive indices suffer from the limitation that a large portion of the power leaks into the substrate. The leakage is caused by the grating, which generates leaky space harmonics that radiate into the substrate at different angles between −50 and 50 degrees. It was discovered that a major portion of the radiation loss to the substrate may be at a finite number of leaky modes. In a preferred embodiment, these mode are radiating into the substrate at roughly three angles of 6°, 27°, and 41°. The present invention provides one or more reflecting stacks in the substrate to recapture the leaked power. Each reflecting stack can be designed to reflect specific leaky modes back to the waveguide to achieve the desired power recovery.

The present invention provides technical advantages including improved coupling efficiency for grating assisted couplers, particularly for semiconductor waveguides with refractive indices ranging from 3.2 to 3.6 coupling onto glass waveguides with refractive indices near 1.5.

Another advantage of an embodiment of the present invention is the simplicity of incorporating the stacks into the design of the semiconductor geometry, since the process does not require additional processing steps. And the fabrication of stacks is well refined within the integrated photonics industry.

BRIEF DESCRIPTION OF THE DRAWINGS

FIG. 3b shows the refractive index profile for the embodiment of FIG. 3a.

DESCRIPTION OF THE PREFERRED EMBODIMENTS

Overview

Grating assisted directional couplers formerly suffered from inefficient coupling for waveguides fabricated from materials with highly different refractive indices where a large portion of the power leaks into the substrate. In one embodiment, it was discovered that there were three major leaky modes that caused radiation loss to the substrate. These modes radiated into the substrate at roughly three angles, namely 6°, 27°, and 41°. The present invention provides one or more reflecting stacks in the substrate to recapture the leaked power.

The substrate stacks are designed to reflect the radiating leaky space harmonics. Each stack was designed to reflect a specific leaky mode. The first stack reflects the first leaky mode and it produces a power reflection coefficient of about 0.4. The second stack is designed to reflect the 2720 leaky mode, and its power reflection coefficient was about 0.3, and finally, the third stack was designed to reflect the 41° leaky mode with a power reflection coefficient of about 0.2. The peak coupling of about 70 percent occurs for a grating length of about 1.4 $\mu$m. By appropriately designing the substrate of the semiconductor laser with the incorporations of alternating layers of semiconductor material (stacks) the coupling efficiency can be increased to the 80 to 90% range. The effect of the stacks is to reduce the radiation losses (due to scattering or leakage of power to the substrate) in the substrate. The grating generates leaky space harmonics that radiate in the substrate at different angles.

Figure 1A:
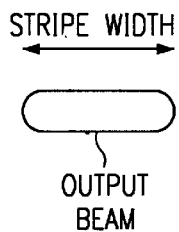
FIGS. 1a–b illustrate the output beam characteristics for semiconductor lasers.
Figure 1B:
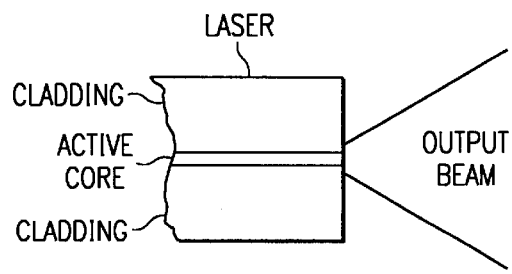
Figure 2A:
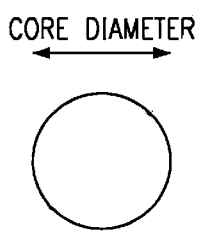
FIGS. 2a–b illustrate the output beam characteristics for optical fibers.
Figure 2B:
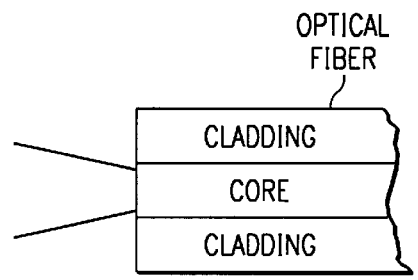
Figure 3B:
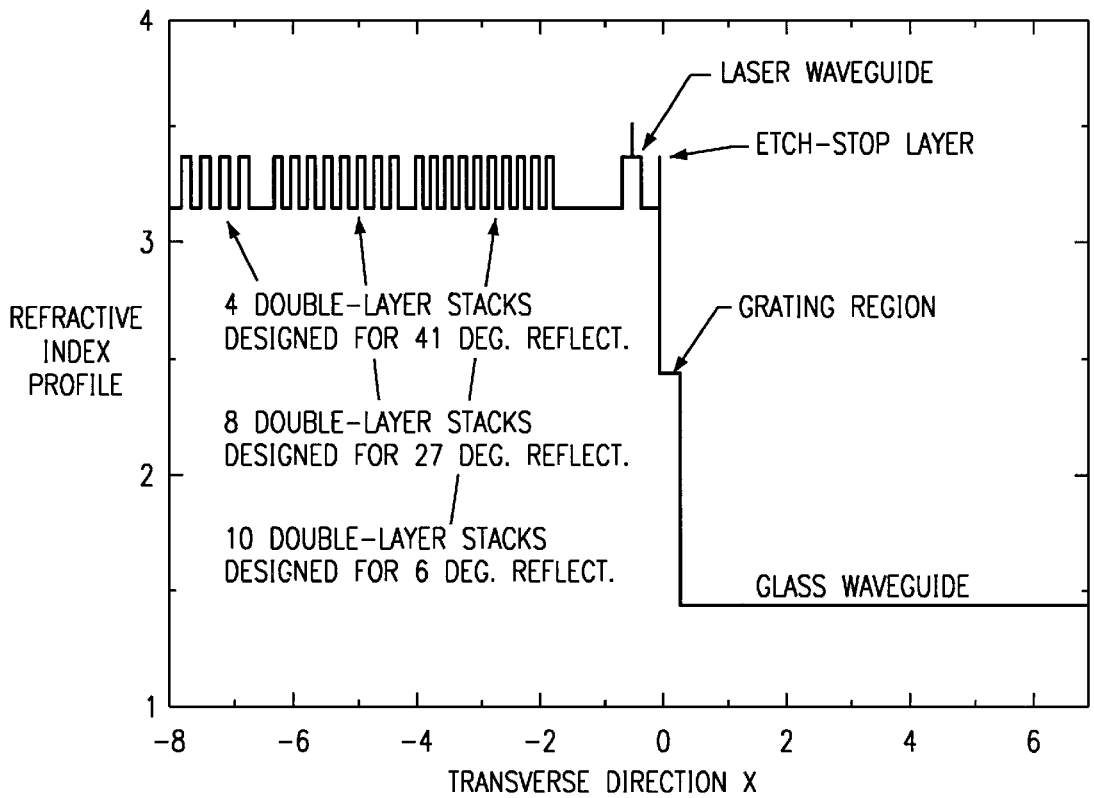
Figure 3A:
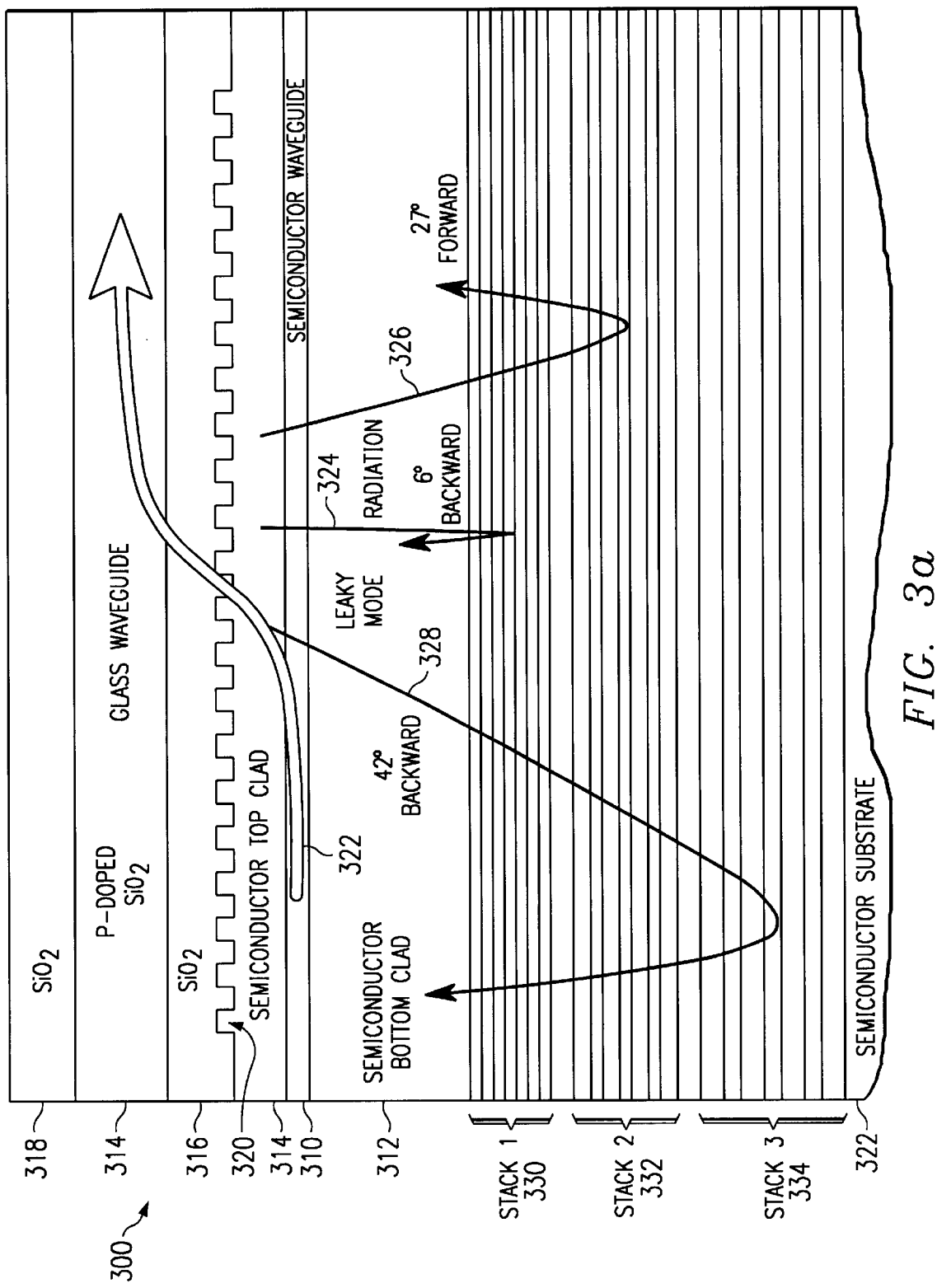
FIG. 3a shows a cross sectional elevation view of a first preferred embodiment grating assisted coupler with reflective stacks to enhance coupling from a semiconductor waveguide to a dielectric waveguide.

FIG. 3a shows a simplified cross sectional elevation of a first preferred embodiment structure, generally indicated by reference numeral 300. A semiconductor waveguide layer 310 is bound on the bottom by Semiconductor bottom clad layer 312, and on the top by semiconductor top clad layer 314. Similarly, glass waveguide layer 314 is bound on the bottom by a glass bottom clad layer 316, and on the top a glass top clad layer 318. A grating 320 is fabricated between the semiconductor top clad 314, and the glass bottom clad 316. Each of these layers are described further below. Grating 320 operates to couple an optical signal from the semiconductor waveguide 310 to the glass waveguide 314 as illustrated by the arrow 322 in FIG. 3.

As discussed above, a portion of the signal on the semiconductor waveguide is reflected back towards the semiconductor substrate 322. In the illustrated embodiment, three major leaky modes with radiation loss to the substrate are shown by arrows 324, 326, 382. These modes radiated into the substrate at roughly the angles of 6° backwards 324, 27° forward 326, and 42° backwards 328. To improve the coupling efficiency, substrate stacks are designed to reflect the radiating leaky space harmonics for one or more of the primary reflective modes. Each stack shown is designed to reflect a specific leaky mode. The first stack 330 reflects the first leaky mode and it produces a power reflection coefficient of about 0.4. The second stack 332 is designed to reflect the 27° leaky mode, and its power reflection coefficient is about 0.3, and finally, the third stack 334 was designed to reflect the 41° leaky mode with a power reflection coefficient of about 0.2. Further details on the fabrication of the substrate stacks is given below.

Substrate Stack Construction

As described above, one or more substrate stacks are incorporated below the grating coupler to enhance the coupling efficiency. In the described embodiment of FIG. 3a, three stacks are fabricated to enhance the coupling efficiency. The stacks comprise alternating layers of material having different indexes of refraction in the same manner as reflective stacks fabricated for lasers. The layers are preferably grown epitaxially on the semiconductor substrate. The materials for the stack are chosen to be compatible with the material system of the coupler. For example, for $\lambda=0.85$ $\mu$m GaAs/AlGaAs is preferred, and for $\lambda=01.55$ $\mu$m InP/InGaAsP is preferred.

FIG. 3b shows a graph of the index of refraction profile for the embodiment of FIG. 3a. The x-axis of the graph represents movement in the transverse x direction through the material, and the y-axis of the graph is the index of refraction of the material at the corresponding location. Table 1 reflects the same data as FIG. 3b and includes the preferred material. The semiconductor substrate, layer 63, is represented by –8 on the x-axis of FIG. 3, and layer 1, glass cladding layer, is represented by +6 on the x-axis of FIG. 3.

TABLE 1

| LAYER NUMBER | REFRACTION INDEX | LAYER THICKNESS $\mu$m | NUMBER OF LAYER(S) | MATERIAL |
| --- | --- | --- | --- | --- |
| 1 | 1.448 | 3.000000 | 1 | glass_cladding |
| 2 | 1.458 | 5.000000 | 1 | glass_waveguide |
| 3 | 1.448 | 1.000000 | 1 | glass_cladding |
| 4 | 3.164981 | 0.250000 | 1 | Grating_layer |
| 5 | 3.386426 | 0.010000 | 1 | etch_stop |
| 6 | 3.164891 | 0.317284 | 1 | p-spacer |
| 7 | 3.386426 | 0.120000 | 1 | Confining_layer |
| 8 | 3.531709 | 0.009000 | 1 | Quantum_well |
| 9 | 3.386426 | 0.010000 | 1 | Barrier |
| 10 | 3.531709 | 0.009000 | 1 | Quantum_well |
| 11 | 3.386426 | 0.010000 | 1 | Barrier |
| 12 | 3.531709 | 0.009000 |  | Quantum_well |
| 13 | 3.386426 | 0.010000 | 1 | Barrier |
| 14 | 3.531709 | 0.009000 | 1 | Quantum-well |
| 15 | 3.386426 | 0.120000 | 1 | Confining_layer |
| 16 | 3.164891 | 1.130000 | 1 | Spacer1_layer |
| 17 | 3.386426 | 0.114996 | 10 | HighStack1 |
| 18 | 3.164891 | 0.123124 | 10 | LowStack1 |
| 37 | 3.164891 | 0.174710 | 1 | Spacer2_layer |
| 38 | 3.386426 | 0.126653 | 8 | HighStack2 |
| 39 | 3.164891 | 0.137784 | 8 | LowStack2 |
| 54 | 3.164891 | 0.270000 | 1 | Spacer3_layer |
| 55 | 3.386426 | 0.147189 | 4 | HighStack3 |
| 56 | 3.164891 | 0.165538 | 4 | LowStack3 |
| 63 | 3.164891 |  |  | Substrate |

Figure 4A:
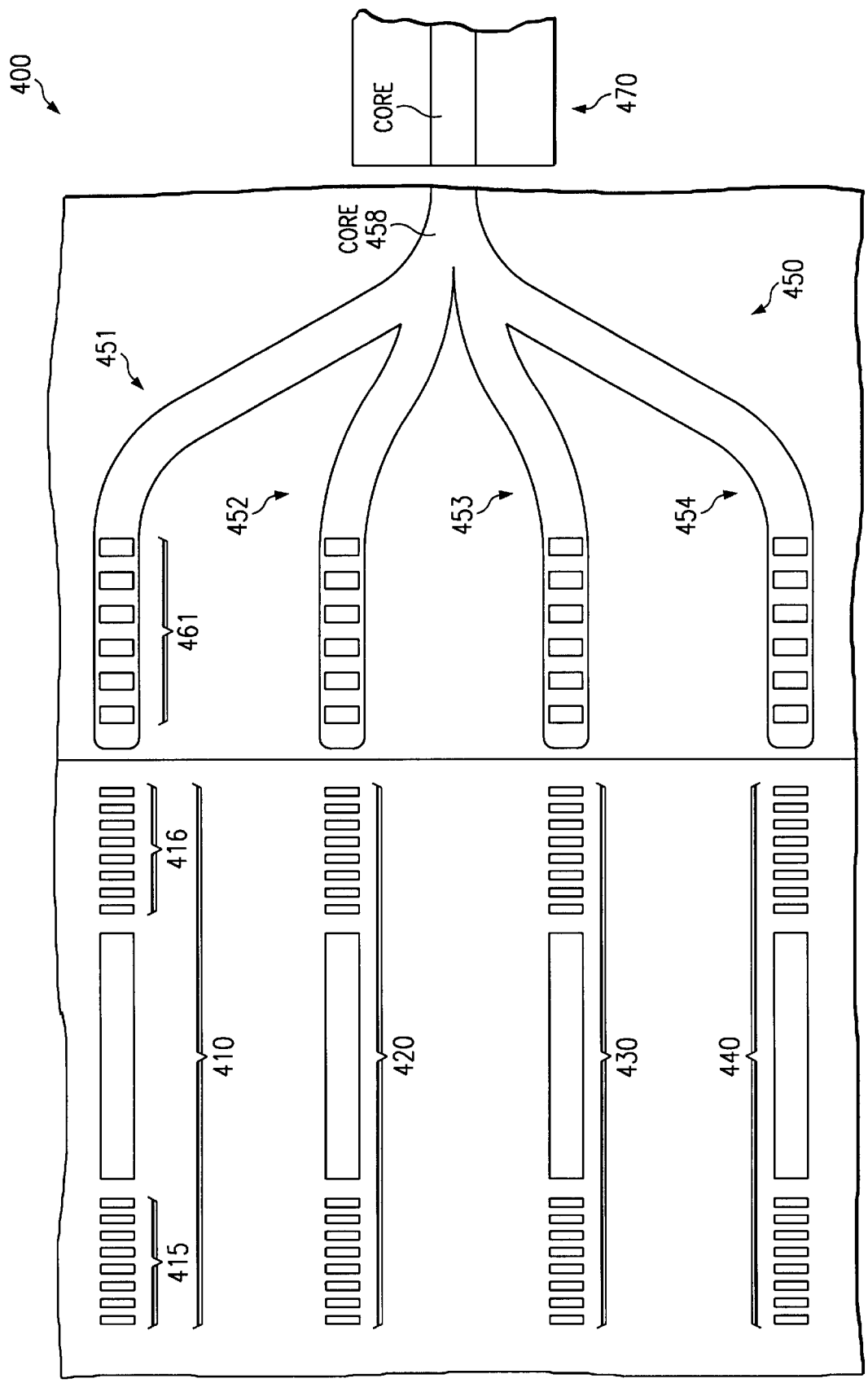
FIGS. 4a–4b are plan and cross sectional elevation views of a first preferred embodiment semiconductor laser and integrated dielectric waveguide.
Figure 4B:
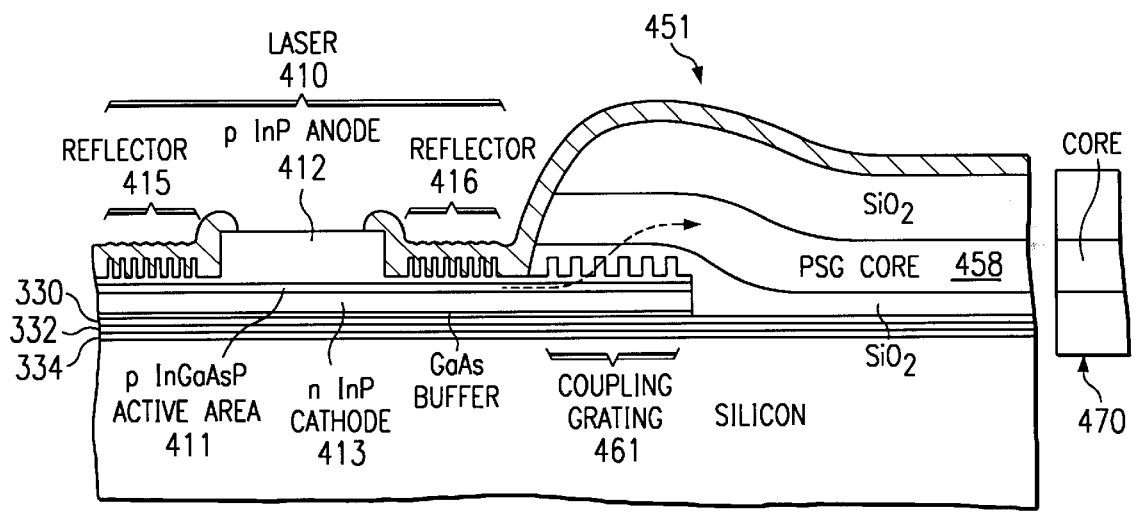

FIGS. 4a–b show in simplified cross sectional elevation and plan views a first preferred embodiment structure, generally indicated by reference numeral 400. This embodiment incorporates the substrate stacks to improve the efficiency of a grating assisted coupler according to the earlier co-assigned invention patent, U.S. Pat. No. 5,673,284. The preferred embodiment includes semiconductor lasers 410, 420, 430, and 440 with outputs coupled to integrated phosphorus doped silicon dioxide (PSG) core waveguide 450 which has branches 451, 452, 453, and 454 of core 458 with each branch coupled to the output of one laser. Each laser has the structure of a heterojunction stripe diode with distributed Bragg reflectors at each end of the active layer; additionally, each laser also has a grating adjacent to the distributed Bragg reflector at one end for enhancing the vertical coupling of the laser output into the overlying branch of waveguide 450. Also, an end portion of optical fiber 470 is shown butt-coupled to waveguide 450 with the core of optical fiber 470 aligned with the waveguide core 458.

In particular, FIG. 4b shows a section through laser 410 and waveguide branch 451 and illustrates p type InGaAsP active area (which includes a four period multiple quantum well for carrier confinement and high efficiency) with p type InP anode 412 and n type InP cathode 413 on either side of the active area. Electrical current flowing through the diode causes electron-hole recombination in the active area (holes from anode 412 and electrons from cathode 413) which releases energy as photons. Outside of the active area the InGaAsP layer forms the core of a semiconductor waveguide with the InP as the cladding. The semiconductor waveguide confines generated photons due to the index of refraction of the InGaAsP core being much greater than that of the InP cladding.

Distributed Bragg reflectors 415 and 416 are formed as fingers (extending in the direction perpendicular to the plane of FIG. 4b) from the p type InP cladding. The period of these reflectors determines the lasing wavelength because reflection occurs when the period is a wavelength. FIGS. 4a–b show only a few fingers in each reflector for simplicity; each reflector typically has on the order of 1140 fingers.

Grating 461 is adjacent reflector 416 and also has fingers formed in p+type InP cladding and parallel to the fingers of reflectors 415–416. Take the period of grating 461 to provide highly efficient coupling of the laser output in the InGaAsP core waveguide into phosphorus doped silicon dioxide glass (PSG) core waveguide 450. The broken arrow in FIG. 4b suggests the coupling. For example, the longitudinal propagation constant (wave vector) in the InGaAsP core equals $2\pi f n_I/c$ where f is the output light frequency, $n_I$, is the effective index of refraction of the InGaAsP core at frequency f, and c is the speed of light in vacuum. Similarly, the propagation constant in PSG core 458 is $2\pi f n_P/c$ with $n_P$ the effective index of refraction of the PSG core. With the period of coupling grating 461 equal to p, the mechanical wave vector of the grating is $2p/p$. Now when the mechanical wave vector of grating 461 equals the difference between the propagation vectors in the InGaAsP and PSG waveguides, the grating effects a highly efficient coupling of the two waveguides for waves of frequency f. That is, in terms of the free space wavelength, 1, take the period p as:

$$1/p = n_I/1 - n_P/1$$

The coupling grating then provides the phase shift for high coupling efficiency. For the first preferred embodiment, the period of grating 461 equals about 700 nm for infrared frequencies. Full coupling between the semiconductor waveguide and the PSG waveguide occurs with a grating length of about 500 μm.

Each of lasers 410, 420, 430, and 440 has a different frequency for lasing with the frequencies determined by the periods of the associated distributed Bragg reflectors. As seen in FIG. 4a, each waveguide branch, 451–454, feeds its associated laser's output into waveguide 450. This comprises wavelength division multiplexing.

Laser

Figure 5A:
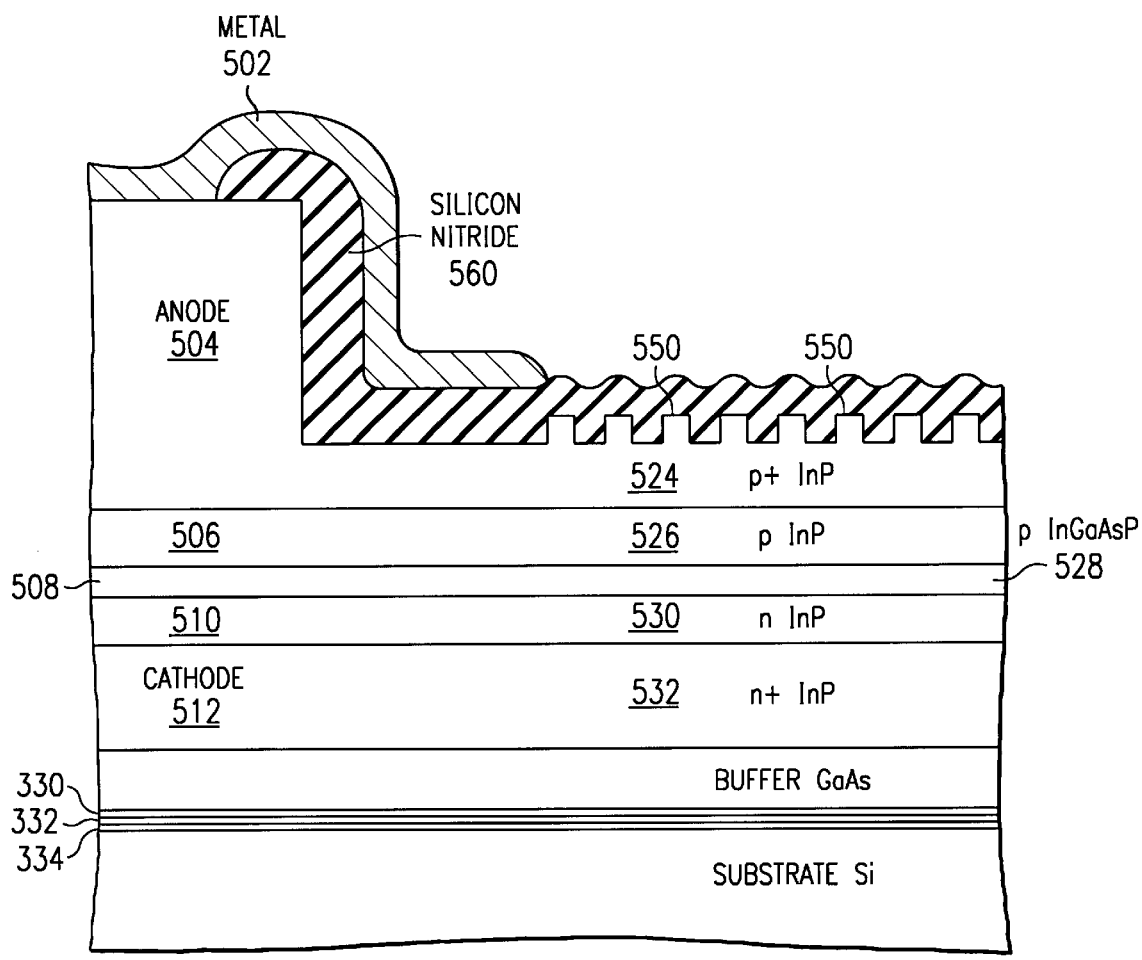
FIGS. 5a–5b illustrate portions of FIG. 4b in greater detail.

FIG. 5a is an enlarged view of a portion of FIG. 4b about the edge of anode 412 and shows metal anode contact 502, p+InP anode 504, p InP anode 506, p InGaAsP active area 508, n InP cathode 510, n+InP cathode 512, p InGaAsP waveguide core 528 with InP cladding by p+InP 524, p InP 526, n InP 530, and n+InP 532. The p InGaAsP layer forming active area 508 and semiconductor waveguide core 528 is a strained layer material system with quantum wells of InGaAs imbedded in InGaAsP barriers and sandwiched by 150 nm thick InGaAsP confinement layers. FIG. 6 shows a band diagram with the conduction and valence band edges. The bandgap of the InGaAs quantum wells is about 0.8 eV, so electron-hole recombination can release infrared light with free space wavelength about the common communication wavelength of 1.55 μm. Varying the quantum well thickness (between 2 and 12 nm) will move the quantized levels and thereby permit adjustment of the recombination energy. The bandgap of the adjoining InGaAsP is about 1.08 eV (corresponding to a free space wavelength of 1.15 μn) and the bandgap of the cladding Inp is about 1.35 eV. The index of refraction of the InGaAsP (3.53) is higher than the index of refraction of the InP cladding (3.16), so the InGaAsP forms the core of a semiconductor waveguide. But the thickness of this core is comprable to or less than the wavelength of the generated light, so only a fraction (about 5%) of the light energy is confined to the InGaAsP core and the light energy extends well into the InP cladding.

The fingers 550 formed in p+InP 524 together with overlying silicon nitride 560 form a distributed Bragg reflector. The reflector acts on the light energy in the semiconductor waveguide and sets the lasing frequency as the frequency for total reflection. The frequency for total reflection simply is frequency at which the reflector fingers 550 have a period equal to a wavelength. The distributed Bragg reflectors have about 1140 fingers with a period of about 440 nm for light with a 1.55 μm free space wavelength.

Each of the lasers 410, 420, 430, and 440 has the following dimensions: stripe width 5 μm (this also is roughly the width and height of the waveguide core 458 and the diameter of the core of butt-coupled optical fiber 470), length 500 μm, active area 508 and core 528 thickness about 0.4 μm, p InP anode 506 and cladding 526 thickness 1.75 μm, p+InP cladding 524 thickness 1.5 μm with distributed Bragg reflector fingers 550 of height 0.05 μm, n InP cathode 510 and cladding 530 thickness 0.75 μm, and n+InP cathode 512 and cladding 532 thickness 2 μm. The separation between adjacent lasers is about 250 μm, so there no crosstalk despite the continuity of the cladding and core layers between the lasers.

Alternative material systems may be used for the strained-layer quantum-well laser. Currently, there are five strained material systems (both compressive and tensile strain) for various wavelength lasers: (1) $In_xGa_{1-x}As/InAs_yP_{1-y}$, (2) $In_xGa_{1-x}As_yP_{1-y}/InP$, and (3) $Al_xGa_yIn_{1-x-y}As/InP$ for telecommunications (typically infrared from 0.9 to 1.55 μm free space wavelengths), (4) AlGa(In)As(P)/GaAs for near infrared, and (5) AlGaInP/GaAs for visible light. To enhance laser performance, reshape the material's band structure to have a higher symmetry by growing the active layer material lattice-mismatched to the substrate.

The $In_XGa_{1-X}As/InAs_YP_{1-Y}$ bandgap and strain are directly correlated, both compressive and tensile strain. The $In_XGa_{1-X}As_YP_{1-Y}/InP$ bandgap and strain can be adjusted independently (tensile strain only). The quantum well thickness is chosen to emit the desired wavelength light. For 1.55 µm, quantum well thickness varies from 3 to 10 nm depending upon whether the material is compressive strained to tensile strained and the amount of the strain.

Waveguide coupler

Figure 5B:
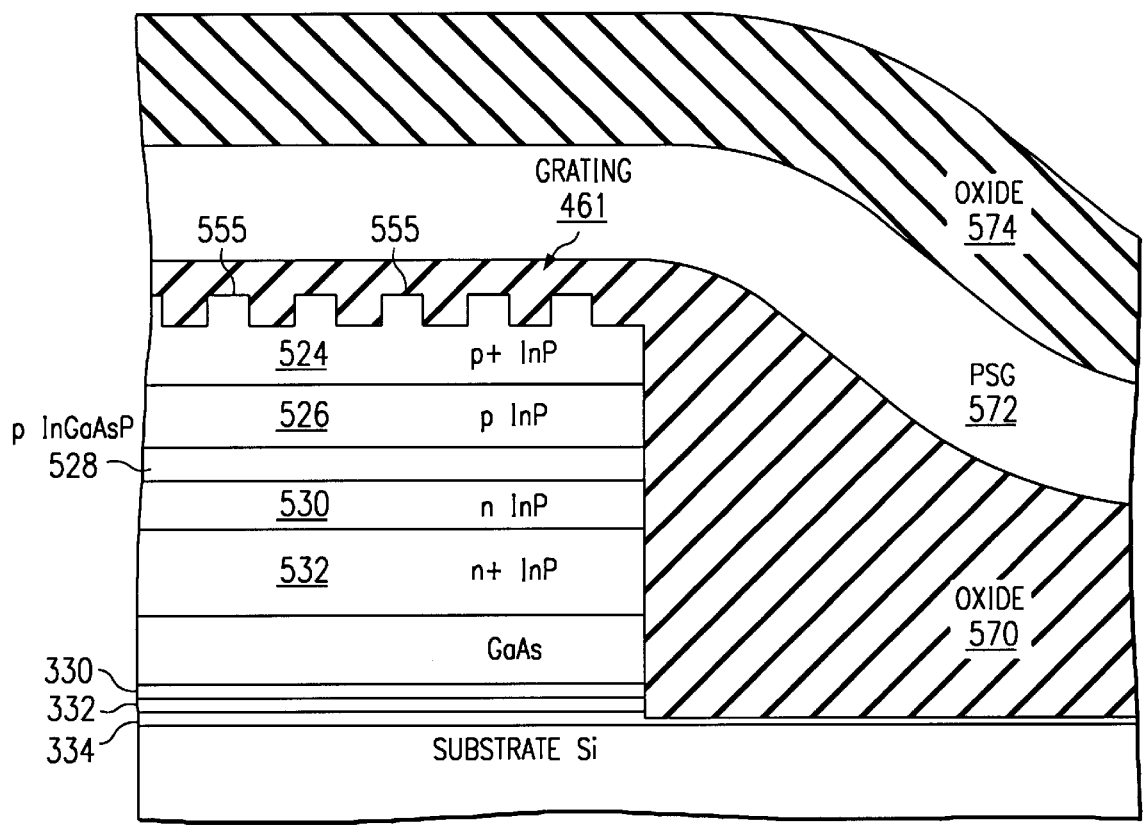
Figure 6A:
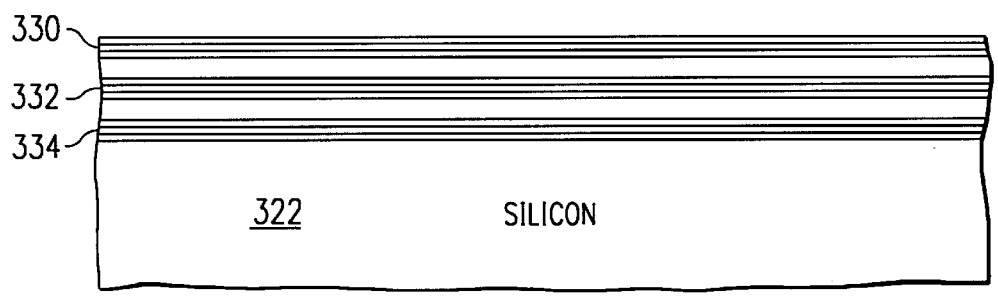
FIGS. 6a–6f show steps in a preferred embodiment process of fabrication.
Figure 6B:
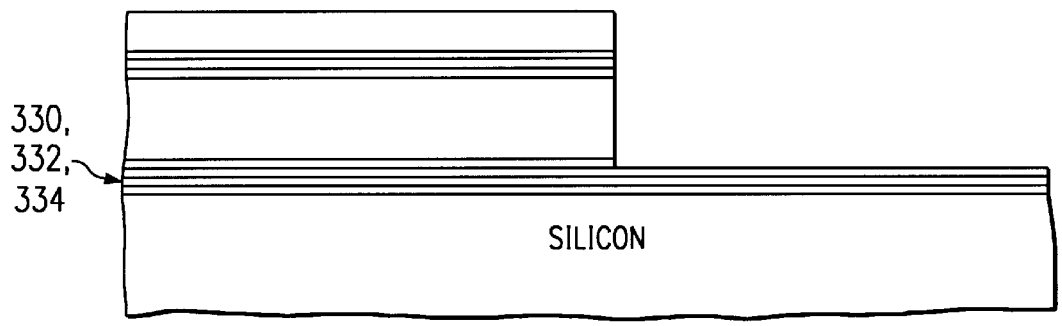
Figure 6C:
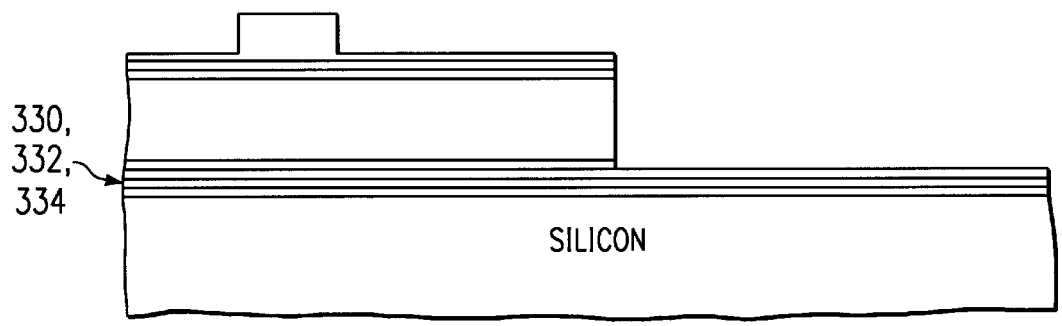
Figure 6D:
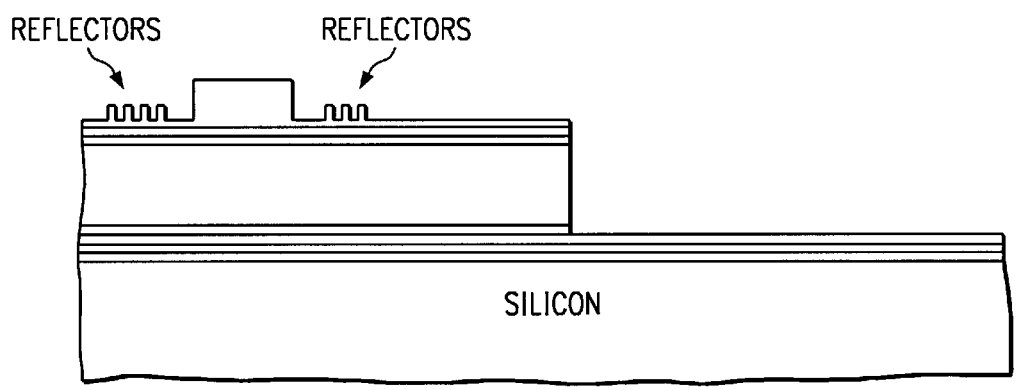
Figure 6E:
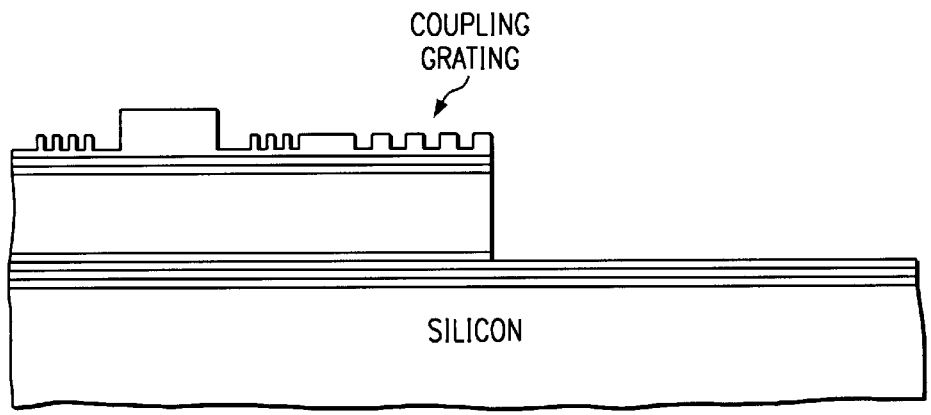
Figure 6F:
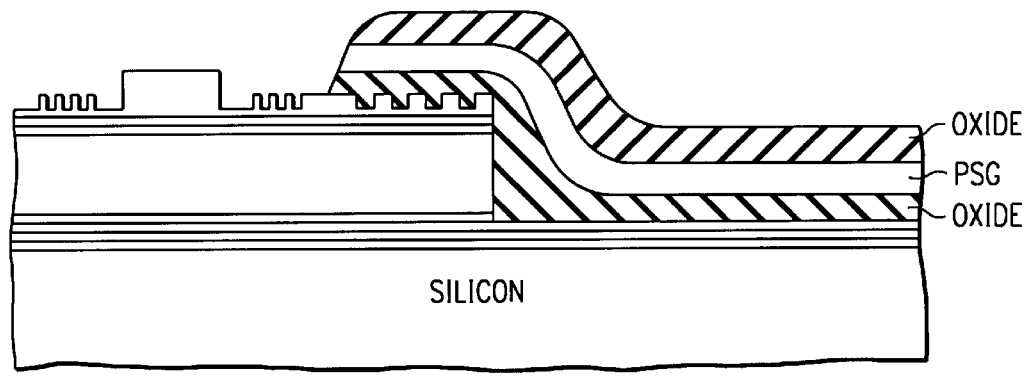
Figure 6G:
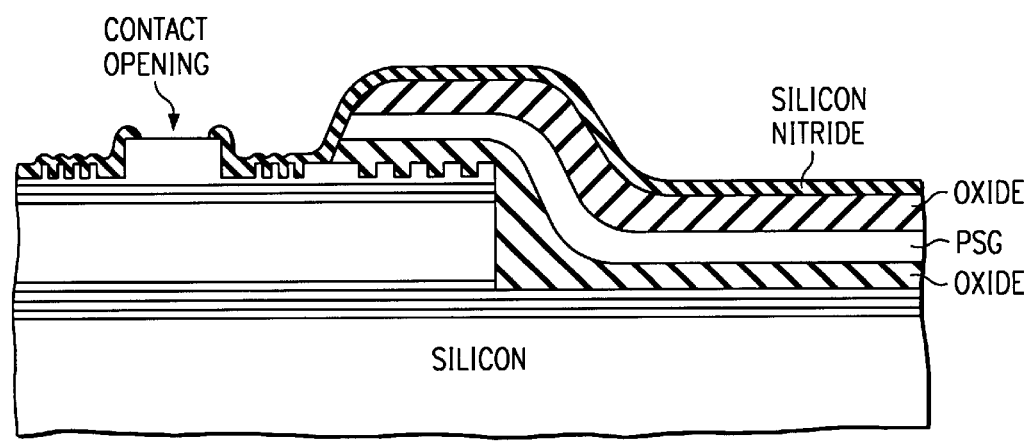

FIG. 5b is an enlarged view of a portion of FIG. 4b about the end of coupling grating 461 and shows p InGaAsP waveguide core 528, p InP cladding 526, p+InP cladding 524, n InP cladding 530, n+InP cladding 532 (all of these layers are extensions of the layers with same reference numerals as FIG. 5a), and grating fingers 555 of height 0.5 µm formed in p+InP 524 with overlying silicon dioxide ("oxide") 570, PSG 572, and oxide 574. Coupling grating 461 has a total length of about 300 µm with a period of about 700 nm; thus coupling grating 461 has about 400 fingers. PSG 572 forms the core of a waveguide with oxide cladding 570 and 574. PSG core 572 has a diameter of about 5 µm and a roughly square cross sectional shape, and overlying oxide 574 has a thickness of about 6 µm. The thickness of oxide 570 directly between fingers 555 and PSG core 572 is about 0.3 µm, but this can be varied to optimize the coupling between the semiconductor waveguide with InGaAsP core 528 and the dielectric waveguide with PSG core 572.

Unlike conventional directional couplers, the longitudinal propagation constants in the semiconductor waveguide and the dielectric waveguide greatly differ. Indeed, for a 1.55 µm free space wavelength, the effective index of refraction of the semiconductor waveguide is about 3.545 and the effective index of refraction of the dielectric waveguide is about 1.4558. Thus coupling due to the interaction of closely spaced evanescent fields is negligible. However, coupling grating 461 has a period of about 0.7 µm (700 nm) and thus a mechanical wave vector K (=2p/period) which, for light with a free space wavelength of 1.55 µm, equals the difference between the longitudinal propagation constant of the semiconductor waveguide and the longitudinal propagation constant of the dielectric waveguide. That is, after dividing by 2p:

$$1/0.7 >> 3.545/1.55 - 1.4558/1.55$$

This implies coupling grating 461 provides the required phase matching between the semiconductor waveguide and the dielectric waveguide for high efficiency coupling.

With different frequencies of operation in the lasers or differing dielectric waveguide materials, the periodicity of coupling grating 461 would be determined in the same manner.

Fabrication

FIGS. 6a–h show in cross sectional elevation view showing the steps of a preferred embodiment method of fabrication of a grating assisted coupler with substrate stacks.

(1) Begin with a silicon substrate and fabricate the substrate stacks as described above.

(2) Grow a GaAs buffer layer, then grow the epitaxial layers as listed in following Table I; note that InGaAsP denotes $In_XGa_{1-X}As_YP_{1-Y}$ for the barrier and spacer layers and InGaAs denotes $In_XGa_{1-X}As$ for the quantum well layers. The GaAs buffer layer is grown at low temperature and provides compensation for the lattice mismatch between silicon and the other layers.

TABLE II

| Layer | Material | Thickness |
| --- | --- | --- |
| Cladding | p+ InP | 5 µm |
| Cladding | p InP | 1.75 µm |
| Spacer | p InGaAsP | 150 nm |
| Quantum well | p InGaAs | 8 nm |
| Barrier | p InGaAsP | 10 nm |
| Quantum well | p InGaAs | 8 nm |
| Barrier | p InGaAsP | 10 nm |
| Quantum well | p InGaAs | 8 nm |
| Barrier | p InGaAsP | 10 nm |
| Quantum well | p InGaAs | 8 nm |
| Barrier | p InGaAsP | 10 nm |
| Quantum well | p InGaAs | 8 nm |
| Spacer | p InGaAsP | 150 nm |
| Cladding | n InP | 0.75 µm |
| Cladding | n+ InP | 2 µm |
| Buffer | GaAs | 15 µm |
| Stacks | GaAs/AlGaAs | |
| Substrate | Si | 500 µm |

(3) Photolithographically define the locations of the four lasers plus coupling gratings, and etch away the grown layers outside of these locations. See FIG. 6a for a cross sectional elevation view.

(4) Photolithographically define the locations of the four laser anodes (rectangles about 5 µm by 300 µm) and etch the p+InP to a thickness of about 2 µm; this leaves four parallel ridges, each about 3 µm high with 5 µm by 300 µm bases. See FIG. 6b. (5) Use holographic lithography to define the fingers for the distributed Bragg reflectors on either end of the ridges formed in step (c). Note that each laser will have a different period in its reflector because four different wavelengths are being multiplexed, so use four separate lithography steps. However, the wavelengths of the four lasers will all be close to a free space wavelength of 1.55 µm. In each holographic lithography step the areas away from the reflectors being defined are masked off and a thin layer of photoresist is applied and two laser sources are used to create the interference pattern for the exposure of the photoresist. Then the p+InP layer is etch with the holographically patterned photoresist as mask to form the fingers of the reflectors. See FIG. 6c.

(6) Repeat the holographic lithography to define the fingers for the coupling gratings. Because the wavelengths of all four lasers are roughly equal, the same coupling grating can be used for all four lasers and thus use only one holographic lithography step. Again, after the interference pattern exposes photoresist and it is developed, etch the p+InP layer to form the coupling gratings. See FIG. 6d.

(7) Deposit a first oxide layer of average thickness 3 µm by decomposition of tetraethoxysilane (TEOS). Next, deposit a PSG layer of thickness 5 µm by decomposition of TEOS with phosphine. Then photolithographically define the location of the PSG core of the dielectric waveguide and its branches, and etch away the PSG outside of the core. The core has a width of 5 µm and thus a cross section that is substantially square. Deposit a second layer of oxide by TEOS decomposition, and photolithographically define the limits of the dielectric waveguide. Then etch the oxides and PSG to complete the dielectric waveguide. See FIG. 6e that shows the oxide covering the fingers of the coupling grating but not the distributed Bragg reflectors. Note that the oxide layers could be left on the distributed Bragg reflectors and replace the silicon nitride of the next step.

(8) Deposit a 0.3 µm thick layer of silicon nitride, and photolithographically define an opening for contact to the laser anodes. Then etch the nitride to form the contact openings to the anodes. Contacts to the n+InP cathode are made by a via etched through the p type layers and lined with insulator. The via could be formed just prior to the nitride deposition and the etch for openings to the anodes could also form an opening to the cathode at the via bottom.

Alternatively, an n+type substrate could be used, and backside contact made to the cathode contact.

Modifications and advantages

The preferred embodiments may be varied in many ways while retaining one or more of the features of a coupling grating integrated between a semiconductor waveguide and a dielectric waveguide.

For example, the materials could be changed such as an InP substrate in place of the silicon substrate and GaAs buffer layer. The structure could be planarized by recessing the area on the wafer where the laser and coupling grating are formed, thus the dielectric waveguide would not go over a step. Alternatively, planarization could be accomplished by a planarization etch after the deposition of the first oxide layer and then another oxide layer deposited for the separation of the coupling grating from the dielectric waveguide core. Other dielectrics such as silicon nitride could be used in place of oxide and PSG in the dielectric waveguide.

The coupling grating could be formed at the core-cladding interface of the dielectric waveguide. The evanescent wave from the InGaAsP core waveguide extends far enough into the oxide and PSG for such a grating to perform the necessary phase shift. But the grating may need to be fairly long, such as 300 μm. Forming this grating just amounts to doing the holographic lithography after the first oxide deposition rather than before it.

The doping types could be changed as long as a diode exists for recombination. The active area could be undoped or made without quantum wells or of more involved quantum well structure.

What is claimed is:

1. A coupler between a semiconductor waveguide and a dielectric waveguide, comprising:
   (a) a grating between said semiconductor waveguide and said dielectric waveguide; and
   (b) at least two reflective stacks adjacent said semiconductor and said dielectric waveguides wherein each reflective stack is configured to reflect power lost to the substrate from a leaky mode of the grating into the dielectric waveguide.

2. The coupler of claim 1, wherein:
   (a) said one or more reflective stacks are located below said grating and on a semiconductor substrate of said semiconductor waveguide.

3. The coupler of claim 2, wherein said one or more reflective stacks comprise:
   (a) a first stack having alternating layers of GaAs having a thickness of 0.147189 μm and AlGaAs having a thickness of 0.165538 μm;
   (b) a second stack having alternating layers of GaAs having a thickness of 0.126653 μm and AlGaAs having a thickness of 0.137784 μm; and
   (c) a third stack having alternating layers of GaAs having a thickness of 0.114996 μm and AlGaAs having a thickness of 0.123124 μm.

4. An integrated circuit, comprising:
   (a) a semiconductor substrate;
   (b) a semiconductor waveguide on said substrate;
   (c) a dielectric waveguide overlaying said semiconductor waveguide;
   (d) a coupling grating between said semiconductor waveguide and said dielectric waveguide; and
   (e) at least two reflective stacks adjacent said grating located below said grating and on said semiconductor substrate wherein each reflective stack is configured to reflect power lost to the substrate from a leaky mode of the grating into the dielectric waveguide.

5. The circuit of claim 4, wherein said one or more reflective stacks comprise:
   (a) a first stack having alternating layers of GaAs having a thickness of 0.147189 μm and AlGaAs having a thickness of 0.165538 μm;
   (b) a second stack having alternating layers of GaAs having a thickness of 0.126653 μm and AlGaAs having a thickness of 0.137784 μm; and
   (c) a third stack having alternating layers of GaAs having a thickness of 0.114996 μm and AlGaAs having a thickness of 0.123124 μm.

6. The circuit of claim 4, wherein said one or more reflective stacks comprise:
   (a) a first stack having alternating layers of GaAs having a thickness of 0.114996 μm and AlGaAs having a thickness of 0.123124 μm; and
   (b) a second stack having alternating layers of GaAs having a thickness of 0.126653 μm and AlGaAs having a thickness of 0.137784 m.

7. The circuit of claim 4, wherein said one or more reflective stacks comprise:
   (a) a first stack having alternating layers which reflect radiation at an angle of 6 degrees backward from said grating;
   (b) a second stack having alternating layers which reflect radiation at an angle of 42 degrees backward from said grating; and
   (c) a third stack having alternating which reflect radiation at an angle of 27 degrees forward from said grating.

* * * * *